United States Patent
Kelley

(10) Patent No.: US 10,368,463 B1
(45) Date of Patent: Jul. 30, 2019

(54) EQUIPMENT BRACKETS, RACK-MOUNTED EQUIPMENT SYSTEMS, AND RELATED METHODS

(71) Applicant: VCE Company, LLC, Richardson, TX (US)

(72) Inventor: Ronald D. Kelley, Apex, NC (US)

(73) Assignee: VCE IP HOLDING COMPANY LLC, Richardson, TX (US)

( * ) Notice: Subject to any disclaimer, the term of this patent is extended or adjusted under 35 U.S.C. 154(b) by 384 days.

(21) Appl. No.: 15/218,480

(22) Filed: Jul. 25, 2016

(51) Int. Cl.
*H05K 7/20* (2006.01)
*H05K 7/14* (2006.01)

(52) U.S. Cl.
CPC ....... *H05K 7/20009* (2013.01); *H05K 7/1487* (2013.01); *H05K 7/1489* (2013.01); *H05K 7/20* (2013.01)

(58) Field of Classification Search
CPC .. H05K 7/1485; H05K 7/1487; H05K 7/1488; H05K 7/1489; H05K 7/18; H05K 7/183; H05K 7/20127; H05K 7/20136; H05K 7/20145; H05K 7/12; H05K 7/14; H05K 7/1417; H05K 7/1407; H05K 7/1401; H05K 5/0021; H05K 5/0221; H05K 7/20645
USPC .......................................................... 454/184
See application file for complete search history.

(56) References Cited

U.S. PATENT DOCUMENTS

| | | | | |
|---|---|---|---|---|
| 6,021,909 A | * | 2/2000 | Tang | H02B 1/36 211/183 |
| 6,209,979 B1 | * | 4/2001 | Fall | H05K 7/1489 312/319.1 |
| 2001/0040142 A1 | * | 11/2001 | Haney | H05K 7/1421 211/183 |
| 2015/0002006 A1 | * | 1/2015 | Segroves | H05K 7/1491 312/236 |

* cited by examiner

*Primary Examiner* — Vivek K Shirsat
*Assistant Examiner* — Ryan L Faulkner
(74) *Attorney, Agent, or Firm* — Jenkins, Wilson, Taylor & Hunt P.A.

(57) ABSTRACT

Equipment brackets, rack-mounted equipment systems, and related methods are disclosed. According to one exemplary embodiment, equipment brackets may include at least one front bracket mounted towards a front of an equipment chassis and configured to be fastened to at least one front rail of an equipment cabinet, wherein the at least one front bracket includes an air flow pocket configured to allow air intake to pass through the air flow pocket before being vented through air vents disposed on the equipment chassis, at least one rear bracket mounted behind the at least one front bracket on the equipment chassis, and at least one rear bracket arm including one or more longitudinally extending prongs having at least a first portion recessed within the at least one rear bracket and configured to be fastened to at least one rear rail of the equipment cabinet.

20 Claims, 10 Drawing Sheets

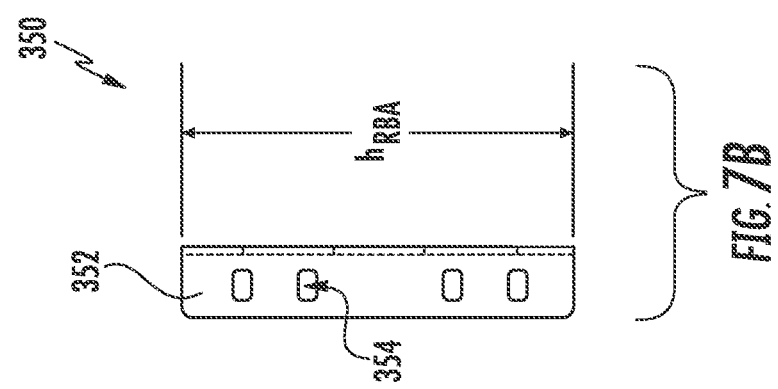
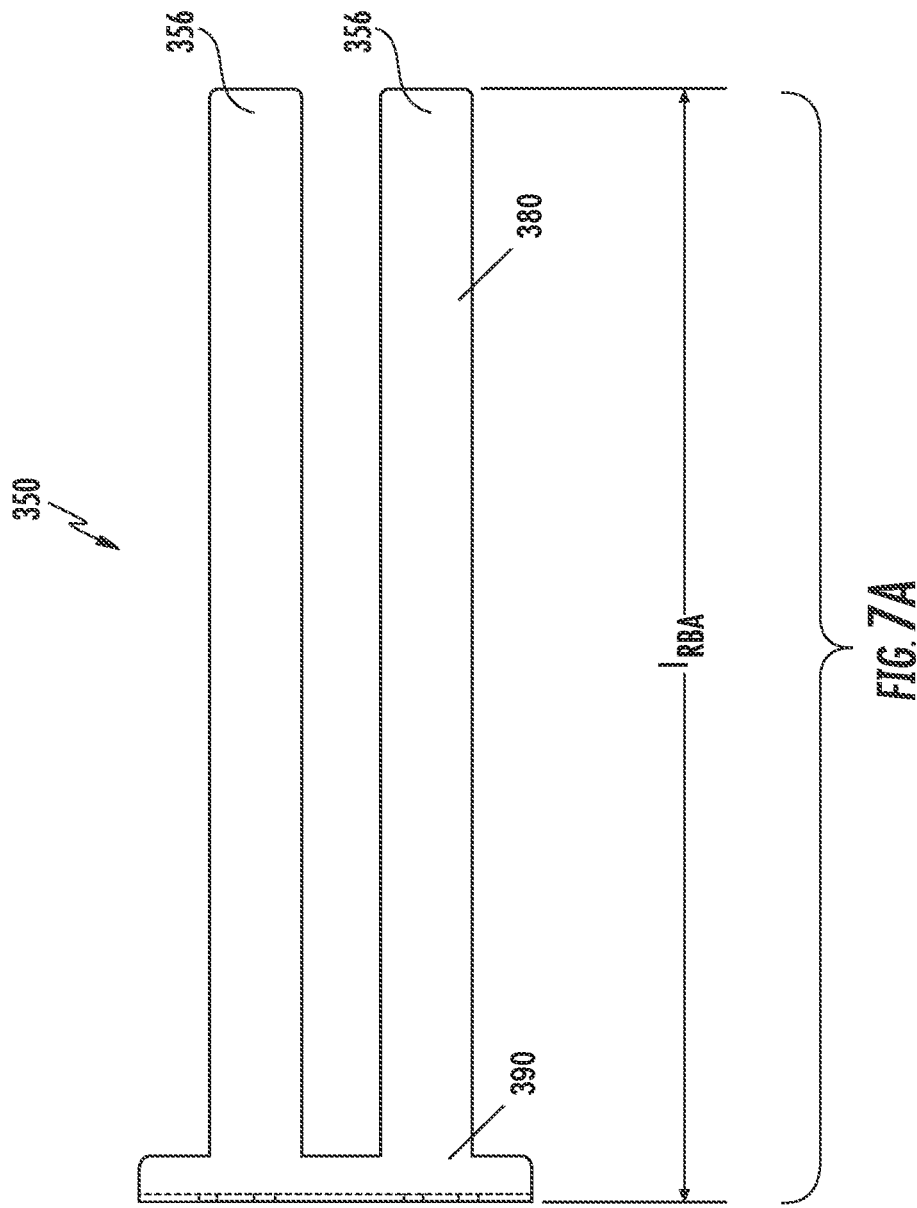

EQUIPMENT BRACKETS, RACK-MOUNTED EQUIPMENT SYSTEMS, AND RELATED METHODS

TECHNICAL FIELD

The subject matter described herein relates generally to equipment brackets installed in equipment cabinets. More specifically, the subject matter relates to equipment brackets, rack-mounted equipment systems, and related methods.

BACKGROUND

Currently, converged infrastructure (CI) network, storage, and computer systems are configured with standard equipment, such as equipment modules or carrier packs of equipment, which may be mounted directly on rails of existing equipment cabinets, containers, etc., or on chassis that are mounted onto the rails of the equipment cabinets. Some standard equipment, such as the CISCO® ASR-1004 router, is/are unable to be fully contained within an existing equipment cabinet, such as an existing 700 mm CI system cabinet, because front doors on these cabinets cannot close over service handles of the standard equipment when the equipment is stored within the cabinet. As a result, such standard equipment must be mounted in larger equipment cabinets, such as, for example, 800 mm CI system cabinets, which are deep enough to accommodate the service handles of the equipment, but are more costly and require more space in a customer data center than typical 700 mm CI system cabinets. Previous attempts at overcoming the disadvantages associated with installing standard equipment in CI system cabinets, such as 700 mm CI system cabinets, have included installing equipment brackets in order to mount the equipment farther back in the cabinet so that the front doors of the cabinet may close over the service handles of the equipment. However, such secondary equipment brackets, which are typically manufactured after-market by third-party manufacturers, tend to be difficult to install and/or to remove and also prevent required air flow for the stored equipment.

SUMMARY

Equipment brackets, rack-mounted equipment systems, and related methods are disclosed. According to one exemplary embodiment, rack-mounted equipment systems may comprise rack-mounted equipment comprising service handles, an equipment cabinet for storing the rack-mounted equipment, the equipment cabinet comprising a front door, and an equipment chassis installed in the equipment cabinet for supporting the rack-mounted equipment stored in the equipment cabinet, and an equipment bracket comprising at least one front bracket mounted towards a front of the equipment chassis and configured to be fastened to at least one front rail of the equipment cabinet, wherein the at least one front bracket comprises an air flow pocket configured to allow air intake to pass through the air flow pocket before being vented through air vents disposed on the equipment chassis, at least one rear bracket mounted behind the at least one front bracket on the equipment chassis, and at least one rear bracket arm comprising one or more longitudinally extending prongs having at least a first portion recessed within the at least one rear bracket and configured to be fastened to at least one rear rail of the equipment cabinet.

BRIEF DESCRIPTION OF THE DRAWINGS

The subject matter described herein will now be explained with reference to the accompanying drawings of which:

FIG. 7A is a side view illustrating an exemplary rear arm bracket of an equipment bracket according to an embodiment of the subject matter described herein;

FIG. 7B is a bottom view illustrating the exemplary rear arm bracket of FIG. 7A;

DETAILED DESCRIPTION

Figure 1:
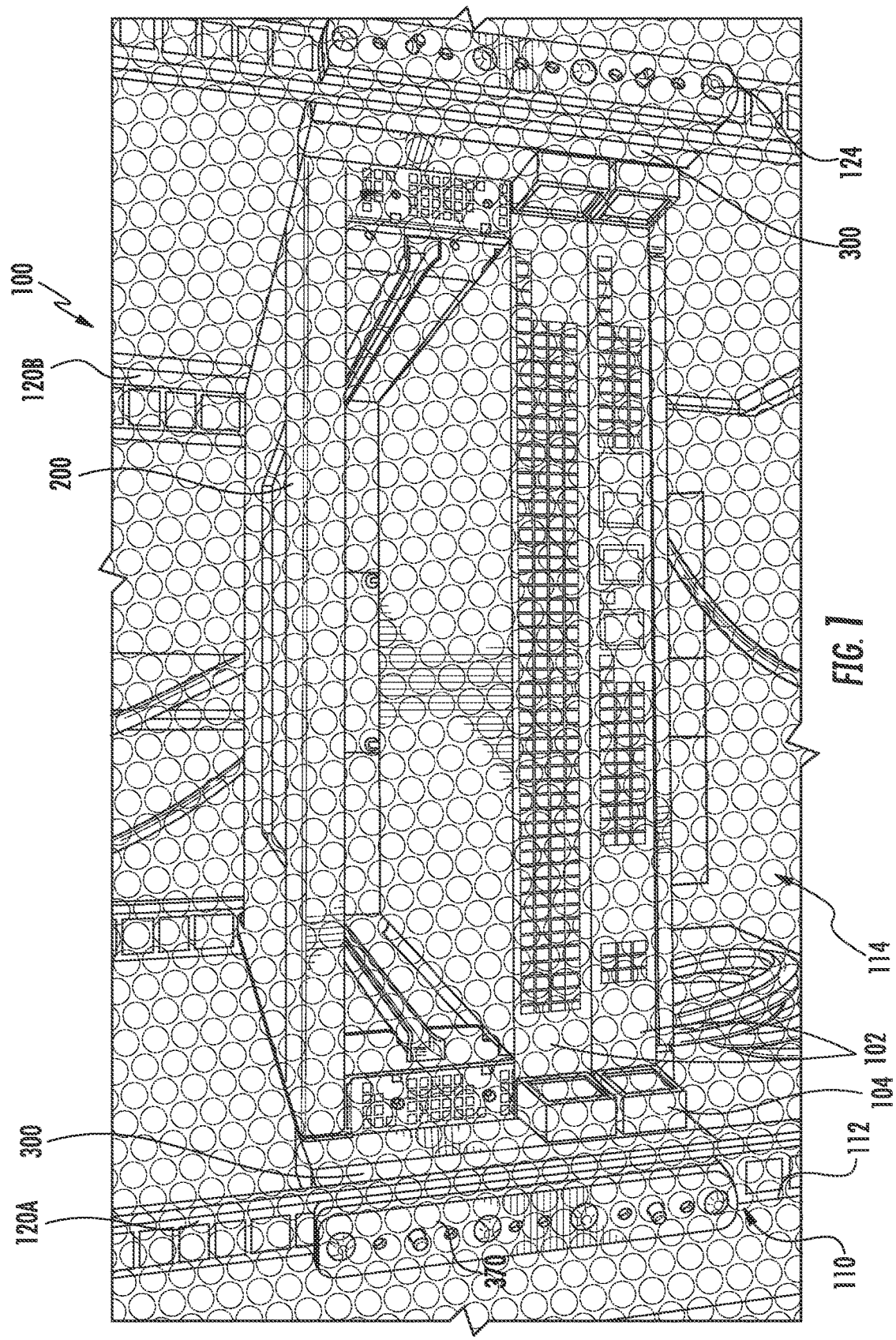
FIG. 1 is a front perspective view illustrating a rack-mounted equipment system comprising an equipment cabinet with a front door closed over an exemplary equipment bracket fastened to rails and mounted on an equipment chassis with equipment stored therein according to an embodiment of the subject matter described herein.

The subject matter described herein discloses equipment brackets, rack-mounted equipment systems, and related methods for installing equipment brackets in equipment cabinets. In particular, the present subject matter discloses equipment brackets that are configured to be mounted onto equipment chassis that support rack-mounted equipment in equipment cabinets and to thereby fasten the equipment chassis to rear surfaces of front and rear rails of the equipment cabinets. Accordingly, such equipment brackets, rack-mounted equipment systems, and related methods described herein may advantageously provide for easy installation and serviceability, proper ventilation (i.e., required ventilation for each piece of equipment), and proper front door and cable clearances so that the front door(s) may close and contain the stored equipment. While the equipment brackets disclosed herein are capable of mounting onto equipment chassis that support equipment comprising service handles disposed at a front of the equipment, such equipment brackets are also capable of mounting onto equipment chassis that support equipment devoid of service handles disposed at a front of the equipment. In this manner, the equipment brackets, rack-mounted equipment systems, and related methods are flexible for use with chassis supporting equipment of many different configurations.

As used herein, "equipment", "standard equipment", "rack-mounted equipment", and/or any similar phrase can comprise a "converged infrastructure system" or "CI system", such as VBLOCK® Systems by VCE Company, LLC, that is composed of one or more individual equipment modules or one or more bundles of individual equipment modules, i.e., carrier packs. In some aspects, a CI system can comprise components and/or elements associated with a preconfigured or prepackaged computing platform. For example, a CI system can comprise a computing platform or unit associated with racks of physical components and/or elements and related software for performing virtualization and/or other functions. In some aspects, a CI system can comprise multiple components and/or elements that include computing components, software components, networking components, storage components, hardware components, and/or firmware components that can be stored in an equipment cabinet (e.g., 700 mm cabinet or an existing CI system cabinet). For example, an exemplary CI system can comprise one or more components and/or elements including equipment modules, data storage devices, servers, routers, networking equipment, and software for managing physical resources and/or virtualized resources (e.g., virtual servers), and/or one or more carrier packs comprising one or more of these components and/or elements.

As used herein, "equipment module" can comprise a "router", "server", "server element", "server module", or any "compute component" that is a router component, server component, a CI component, or any like physical or hardware component.

Reference will now be made in detail to exemplary embodiments of the subject matter described herein, examples of which are illustrated in the accompanying drawings. Wherever possible, the same reference numbers will be used throughout the drawings to refer to the same or like parts.

Figure 2:
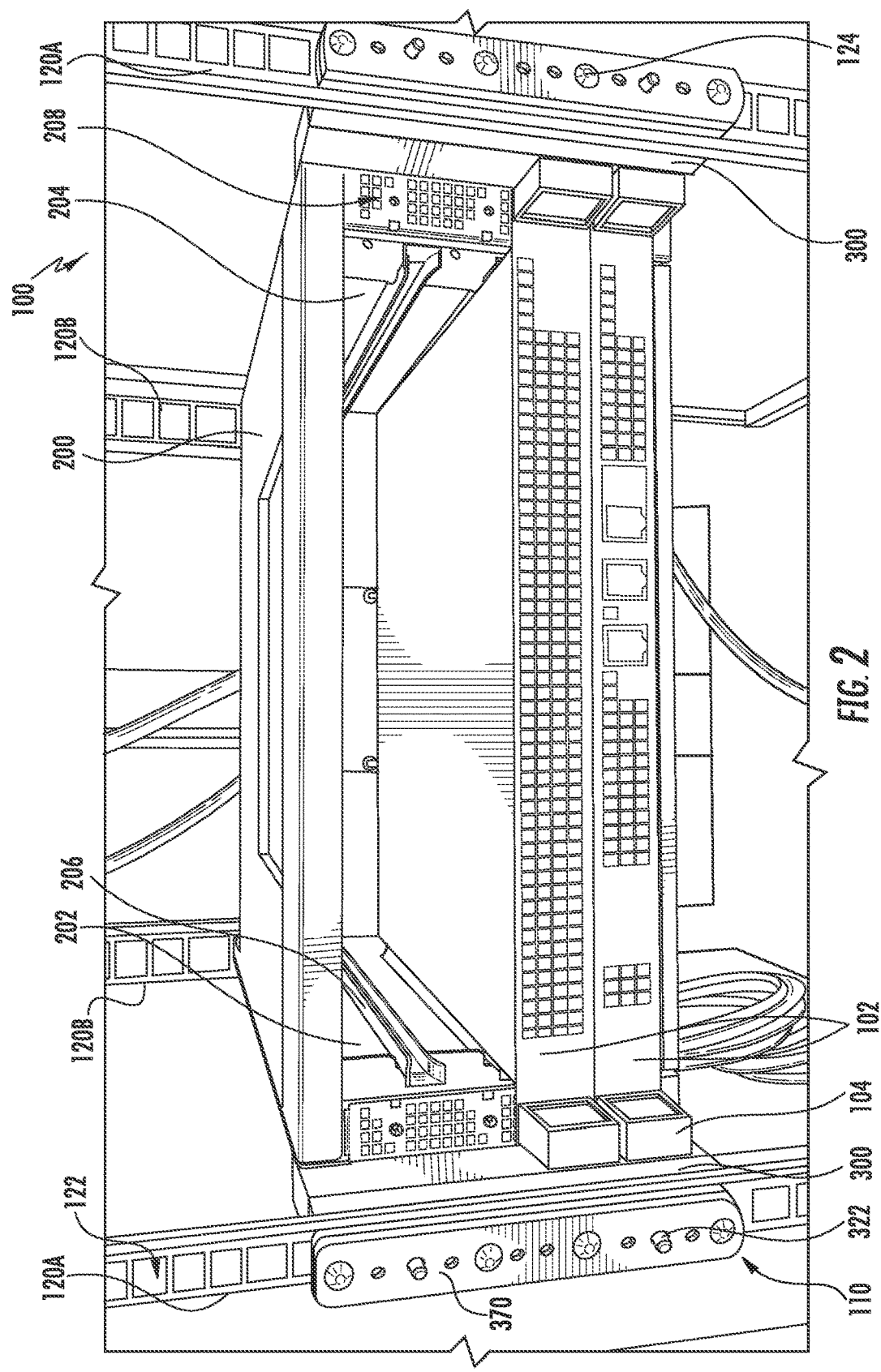
FIG. 2 is a front perspective view illustrating the rack-mounted equipment system of FIG. 1 without the front door closed.
Figure 3:
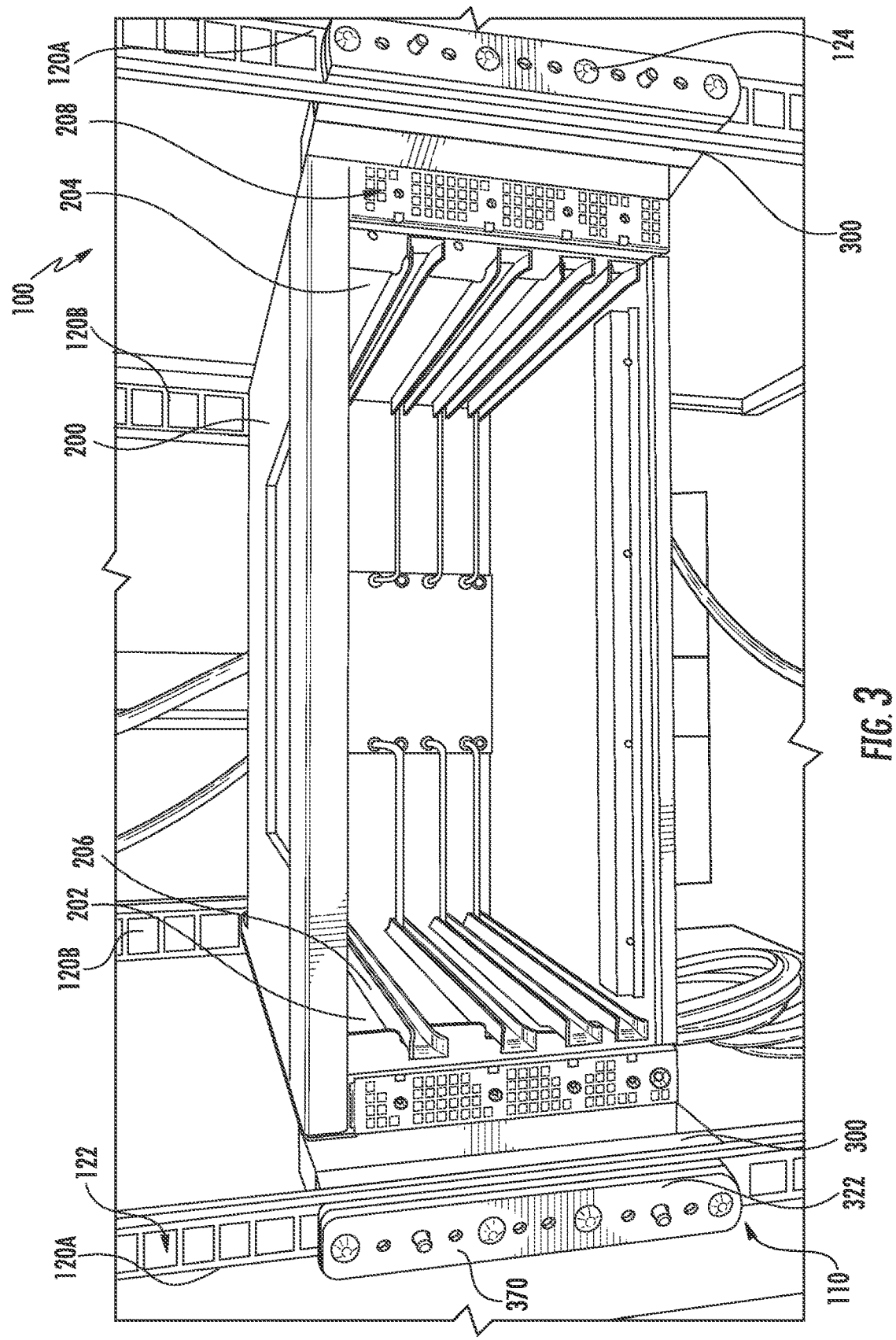
FIG. 3 is a front perspective view illustrating the rack-mounted equipment system of FIG. 2 without the equipment stored therein.

FIGS. 1-3 are front, perspective views illustrating an exemplary rack-mounted equipment system, generally designated 100, according to an embodiment of the subject matter described herein. As illustrated in both FIGS. 1-3, rack-mounted equipment system 100 may comprise an equipment cabinet, generally designated 110, configured to store equipment, generally designated 102, including at least one equipment module or a carrier pack of equipment within. In some aspects, equipment 102 may comprise, for example, a CISCO® ASR-1004 router, although equipment having other functions, sizes, compatibilities, etc., is contemplated to be stored within cabinet 110. Regardless, equipment 102 is stored within cabinet 110 via an equipment chassis, generally designated 200. For example, and as illustrated in FIGS. 1-2, chassis 200 may be configured to support equipment 102, where such equipment 102 comprises up to four standard equipment modules. In FIGS. 1-2, two standard equipment modules are supported within chassis 200, while in FIG. 3, no standard equipment modules are supported within chassis 200. As used herein, "standard equipment modules" are components that are configured to be supported within standard equipment cabinets and comprise front mounted service handles, generally designated 104, that extend from a front of the equipment modules past chassis 200 and are used to access each equipment module, individually. For example, a standard equipment module may be selected from a list consisting of, but not limited to, a CISCO® ASR 1000 series RP1, a CISCO® ASR 1000-ESP10, a CISCO® ASR 1000-ESP20, a CISCO® ASR 1000-ESP40, a CISCO® ASR 1000 series SIP, and/or any compute element or component comprising similar structure, functionality, etc.

Advantageously, and in comparison with conventional rack-mounted equipment systems, where a front door of an equipment cabinet is unable to fully shut over, and thereby enclose, rack-mounted equipment provided therein, chassis 200 of rack-mounted equipment system 100 is mounted to rails 120A-120B of equipment cabinet 110 via an equipment bracket, generally designated 300, in a manner described in greater detail below, such that a front door 112 of equipment cabinet 110 is able to shut over and fully enclose equipment 102 therein. For example, a clearance of about 3.75 inches exists between service handles 104 and front door 112 when front door 112 is in a closed position. More particularly, equipment cabinet 110 is illustrated in FIG. 1 with front door 112 shut over front mounted service handles 104 of equipment 102. In some aspects, front door 112 is a ventilated door comprising a plurality of holes 114. Shutting front door 112 to enclose equipment 102 may be desirable as it protects equipment 102 stored within cabinet 110, while still allowing adequate air supply through plurality of holes 114. Front door 112 may comprise a locking mechanism (not shown) in order to prevent unauthorized access to equipment 102, as well.

Referring now to FIGS. 2-3, equipment cabinet 110 is illustrated without front door 112 in order to provide a more detailed view of equipment bracket 300 mounted onto chassis 200 and fastened to rails 120A-120B of equipment cabinet 110. In some aspects, chassis 200 comprises a first (left) side 202, a second (right) side 204, a ventilated rear, and an open front, such that chassis 200 forms a ventilated enclosure. One or more rails 206 may be provided on each of first side 202 and/or second side 204 of equipment chassis 200 so that slots are formed by opposing pairs of rails 206. Each pair of rails 206 forming a slot may be configured to receive an equipment module, such that a number of pairs of opposing rails 206 within chassis 200 corresponds to a number of individual equipment modules that chassis 200 is capable of receiving. For example, like in FIG. 1, the four pairs of rails 206 corresponds to chassis 200 being configured to receive four standard equipment modules, two of which have already been received within chassis 200, as illustrated in FIGS. 1-2. In some aspects, equipment chassis 200 may be approximately 6.95 inches in height, 17.25 inches in width, and 22.50 inches in depth, and require approximately 4 RUs of space within equipment cabinet 110. Alternatively, chassis 200 may be smaller or larger depending on the functionality and/or performance requirements of equipment 102 received and/or stored within chassis 200.

In some aspects, and referring to FIG. 3, specifically, chassis 200 may comprise one or more air vents 208 disposed towards a front edge of first side 202 and second side 204. Air vents 208 may comprise a plurality of vented openings that allow airflow from an exterior of chassis 200 to an interior of chassis 200 to ventilate equipment 102. Air vents 208 may be disposed an entirety of a height of chassis 200 such that the plurality of vented openings extend approximately 6.95 inches on the front edge of first side 202 and second side 204. The plurality of vented openings may, in some aspects, be disposed in a pattern that may vary depending on flow requirements for each equipment module received within chassis. For example, more vented openings may be provided for equipment modules that are larger and less vented openings may be provided for equipment modules that are smaller.

In some aspects, equipment cabinet 110 may include front equipment rails 120A (i.e., front rails) and rear equipment rails 120B (i.e., rear rails). For example, front equipment rails 120A may be provided on a first side and a second side, i.e., right and left side, while rear equipment rails 120B may be provided on a first side and a second side, i.e., right and left side, to form a cabinet 110 with a polygonal shape. Thus, rails 120A-120B may be provided at each of the four corners of the equipment cabinet, where cabinet 110 is configured as square, rectangle, etc. In other aspects, additional rails may be provided in intermediate locations, such as in between front rails 120A and rear rails 120B. For example, six rails may be provided—one in each corner and one in between each of the right front and rear rails and the left front and rear rails. As used herein, "right" and "left" refer to the sides of the cabinet from a front perspective view, for example as illustrated in FIG. 2.

In some aspects, equipment cabinet 110 may be configured as a 700 mm rack (27.6 inches) having a standardized rail configuration within defined by rails 120A-120B. For example, rails 120A-120B within cabinet 110 may be configured as, for example, a 19" Electronic Industries Alliance (EIA) rack, a 23" EIA rack, an Open Rack, etc., for mounting chassis 200 thereto. Where rails 120A-120B of equipment cabinet 110 are configured as a standardized equipment rack, such as, e.g., a standard EIA 19" rack, front rails 120A and/or rear rails 120B may comprise a plurality of holes, generally designated 122. For example, plurality of holes 122 may be disposed in an even distribution along an axial length of each of rails 120A-B. In some aspects, each of plurality of holes 122 may be configured as a standard cage nut hole capable of receiving a fastener, generally designated 124, for mounting equipment bracket 300 to front rails 120A and/or rear rails 120B. For example, each fastener 124 may comprise a cage nut with or without one or more washers, a screw, or the equivalent. In some aspects, plurality of holes 122 may be suitably disposed, such as approximately 0.625 inches apart from center to center along an axial length of rails 120A-120B. Alternatively, plurality of holes 122 may comprise any diameter, shape, distribution, etc., along rails 120A-120B. Accordingly, fasteners 124 may be configured to be received through rails 120A-120B and secure equipment bracket 300 thereto.

Figure 4:
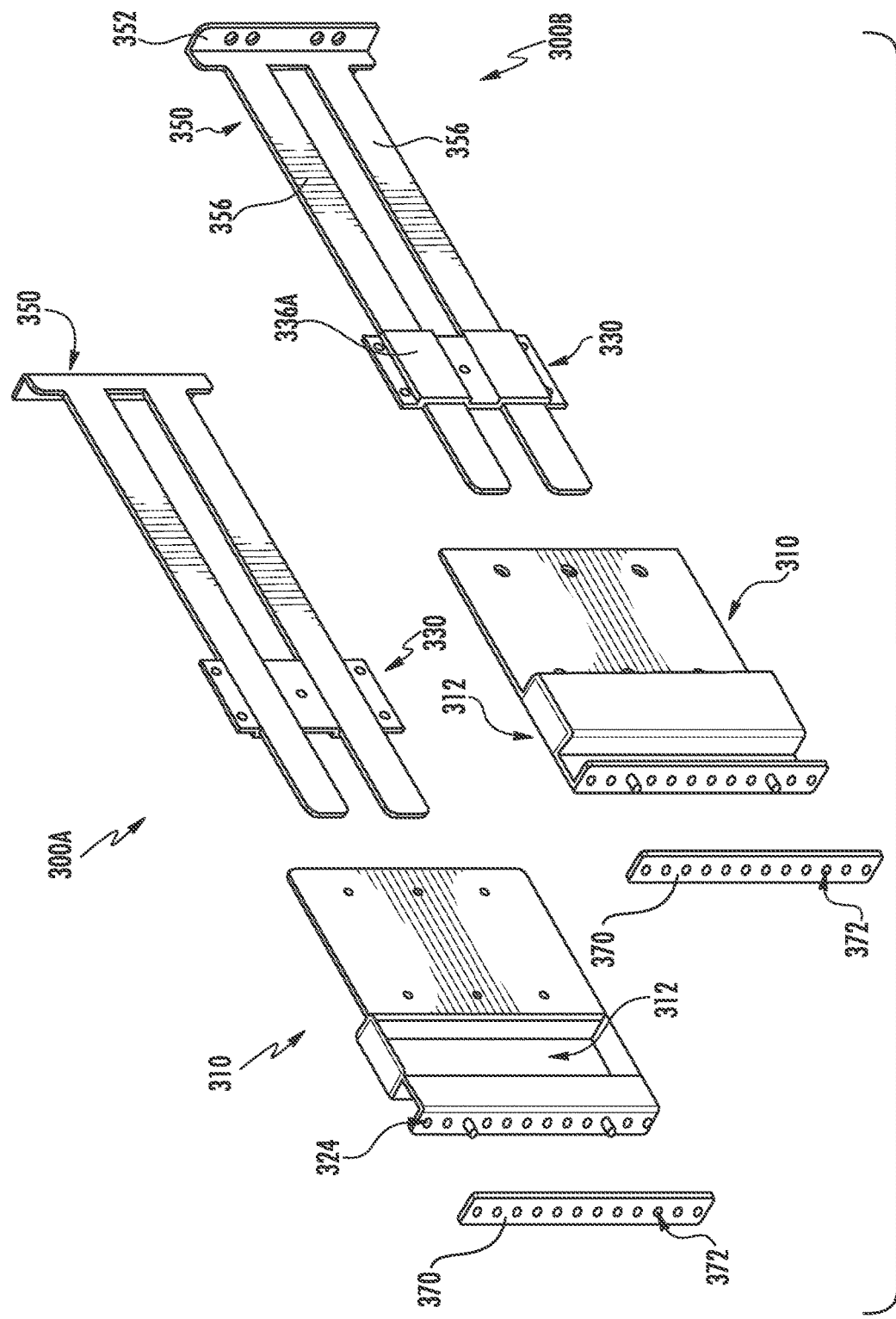
FIG. 4 is a partially exploded view illustrating exemplary right and left equipment brackets according to an embodiment of the subject matter described herein.

Referring now to FIGS. 4-7B, equipment bracket 300 will be described in further detail. FIG. 4 illustrates a partially exploded view of a left equipment bracket, generally designated 300A, and a right equipment bracket, generally designated 300B, each including a front bracket, generally designated 310, a rear bracket generally designated 330, a rear bracket arm generally designated 350, and a front plate generally designated 370. Left equipment bracket 300A is configured to be disposed on an exterior of first side 202 of chassis 200 while right equipment bracket 300B is configured to be disposed on an exterior of second side 204 of chassis 200. In some aspects, equipment brackets 300A, 300B may comprise a material configured to support static and/or dynamic load requirements of equipment 102 supported within chassis 200. Static and/or dynamic load requirements may vary depending on a weight of equipment 102. In some aspects, chassis 200 is configured to receive equipment 102 weighing no more than 50 pounds, fully configured, although this is just one example and in no way limiting. Accordingly, each element (i.e., front bracket 310, rear bracket 330, rear bracket arm 350, front plate 370) of equipment brackets 300A, 300B may comprise a metal or metallic material (e.g., aluminum (Al), steel, iron (Fe), alloys thereof, etc.), any non-metallic material (e.g., plastic, polymeric, etc.), and/or any combinations thereof, sufficient to support static and/or dynamic load requirements of equipment 102 received within chassis 200. For example, equipment brackets 300A, 300B may comprise galvanized steel.

Figure 5A:
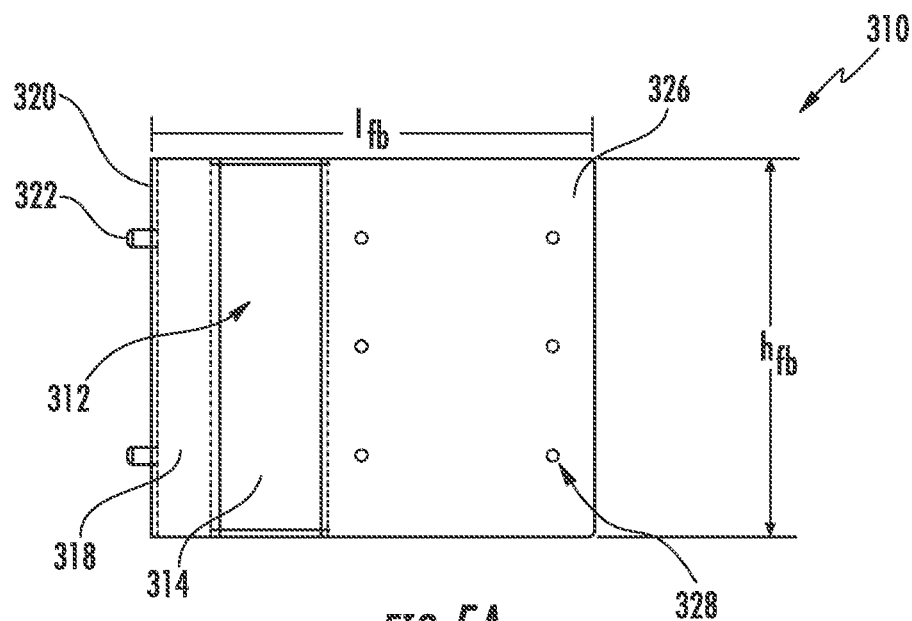
FIG. 5A is a side view illustrating an exemplary front bracket of an equipment bracket according to an embodiment of the subject matter described herein.
Figure 5B:
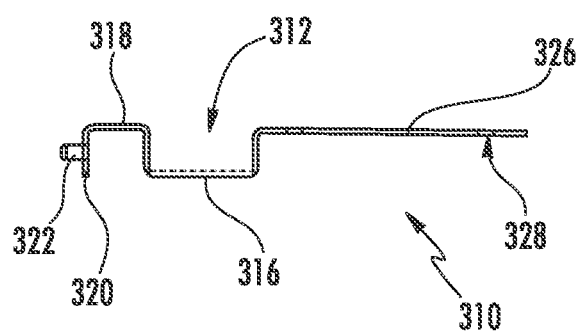
FIG. 5B is a bottom view illustrating the exemplary front bracket of FIG. 5A.

According to FIG. 4, and illustrated in more detail in FIGS. 5A-5B, front bracket 310 comprises an air flow pocket 312 that is dimensioned in order to provide optimal air flow to equipment 102 supported within chassis 200. Air flow pocket 312 may comprise a flow surface, generally designated 314, in which air intake may pass through before being vented through (i.e., passing through) air vents 208 disposed on chassis 200, and a back surface 316 disposed on a surface opposing flow surface 314. In some aspects, flow surface 314 and/or back surface 316 comprise a height that is substantially a same as a height of front bracket 310. For example, a height of front bracket $h_{FB}$ may be approximately 6.975 inches, which is approximately a same height as chassis 200. A length of front bracket $l_{FB}$ may be approximately 8.31 inches. In some aspects, for example, a height of flow surface 314 and/or back surface 316 is approximately 6.975 inches and comprises a width of approximately 2.11 inches minus a thickness of front bracket. Thus, a height of front bracket $h_{FB}$ and a height of flow surface 314 are substantially equivalent. A depth of air flow pocket 312 may be approximately 0.875 inches, which may result in a volume of air flow pocket 312 being approximately 12.878 cubic inches. In other aspects, flow surface 314 and/or back surface 316 may comprise dimensions different than dimensions of front bracket 310 and a depth of air flow pocket 312 may also be larger or smaller than 0.875 inches such that a volume of air flow pocket 312 may vary depending on the dimensions of air flow pocket 312. Advantageously, the 8.31 inch length of front bracket $l_{FB}$ may be approximately 3.31 inches longer than conventional five inch front brackets in order to provide additional room, lengthwise, in cabinet 110 for handles 104 of equipment 102. More particularly, front brackets 310 may mount to chassis 200 and front rail 120A such that there is approximately 3.75 inches of space between service handle 104 and door 112. In this manner, door 112 may be able to completely shut over service handles 104.

Still referring to front bracket 310, a first planar surface, generally designated 318, may be disposed along a front, open edge of air flow pocket 312, such that the front, open edge of air flow pocket 312 may separate first planar surface 318 from flow surface 314. For example, first planar surface 318 may be disposed at approximately a 90 degree angle along the front, open edge of air flow pocket 312 and flow surface 314 may be disposed at approximately a 90 degree angle along the front, closed edge of air flow pocket 312. In this manner, first planar surface 318 and flow surface 314 may be substantially parallel to one another, albeit in separate planes. In some aspects, a separation between first planar surface 318 and flow surface 314 may be determined based on a depth of air flow pocket 312, as a size of front, open edge of air flow pocket 312 may define a depth of air flow pocket 312. Thus, the deeper air flow pocket 312 is, the farther apart first planar surface 318 may be from flow surface 314. For example, a separation between first planar surface 318 and flow surface 314 may be approximately 0.875 inches or a depth of air flow pocket 312.

In some aspects, first planar surface 318 may comprise a height that is substantially a same as a height of front bracket 310. For example, a height of first planar surface 318 may be approximately 6.975 inches, which is approximately a same height as front bracket 310 as well as chassis 200. In some aspects, for example, first planar surface 318 may also comprise a length that may be less than a length of flow surface 314. For example, first planar surface 318 may comprise a length of approximately 1.2 inches, although other dimensions less than, equal to, or greater than are also contemplated.

A pin surface, generally designated 320, may be disposed along a front edge of first planar surface 318 opposing the edge along which first planar surface 318 is disposed along the front, open edge of air flow pocket 312. In some aspects, pin surface 320 may be disposed at approximately a 90 degree angle along the front edge of first planar surface 318. In this manner, pin surface 320 and front, open edge of air flow pocket 312 may be substantially parallel to one another, albeit in separate planes. In some aspects, pin surface 320 may comprise a height that is substantially a same as a height of front bracket 310. For example, a height of pin surface 320 may be approximately 6.975 inches, which is approximately a same height as front bracket 310 as well as chassis 200. In some aspects, pin surface 320 may comprise a width that is a same as a depth of front, open edge of air flow pocket 312. For example, pin surface 320 may comprise a width and front, open edge of air flow pocket 312 may comprise a depth of approximately 0.875 inches, although other dimensions less than, equal to, or greater than are also contemplated.

One or more alignment pins, generally designated 322, may be disposed on pin surface 320 in order to ease installation of chassis 200 with front brackets 310 installed thereon on front rails 120A of a cabinet. More particularly, alignment pins 322 may be used to rest within plurality of holes 122 on front rails 120A prior to fastening of chassis 200 to the front rails. However, one or more alignment pins 322 are merely a convenience and may be configured to be removable from pin surface 320. FIGS. 4-5B each illustrate pin surface 320 comprising two alignment pins 322. For purposes of adjustability, pin surface 320 may comprise one or more holes, generally designated 324, evenly distributed along a height of pin surface 320 through which one or more alignment pins 322 may be configured to be removably slidable within. For example, there may be ten (10) tapped holes 324 evenly distributed along pin surface 320 through which one or more alignment pins 322 may be removed and replaced.

A second planar surface, generally designated 326, may be disposed along a rear, open edge of air flow pocket 312, such that the rear, open edge of air flow pocket 312 may separate second planar surface 326 from flow surface 314. For example, second planar surface 326 may be disposed at approximately a 90 degree angle along the rear, open edge of air flow pocket 312 and flow surface 314 may be disposed at approximately a 90 degree angle along the rear, closed edge of air flow pocket 312. In this manner, second planar surface 326 and flow surface 314 may be substantially parallel to one another, albeit in separate planes. Notably, however, first planar surface 318 and second planar surface 326 may be substantially coplanar. In some aspects, a separation between second planar surface 326 and flow surface 314 may be determined based on a depth of air flow pocket 312, as a size of rear, open edge of air flow pocket 312 may define a depth of air flow pocket 312. Thus, the deeper air flow pocket 312 is, the farther apart second planar surface 326 may be from flow surface 314. For example, a separation between second planar surface 326 and flow surface 314 may be approximately 0.875 inches or a depth of air flow pocket 312.

In some aspects, second planar surface 326 may comprise a height that is substantially a same as a height of front bracket 310. For example, a height of second planar surface 326 may be approximately 6.975 inches, which is approximately a same height as front bracket 310 as well as chassis 200. In some aspects, for example, second planar surface 326 may also comprise a length that may be more than a length of flow surface 314. For example, second planar surface 326 may comprise a length of approximately 5.0 inches, although other dimensions less than, equal to, or greater than are also contemplated.

A plurality of mounting holes, generally designated 328, may be provided on second planar surface 326. For example, FIGS. 4 and 5A, in particular, illustrate six (6) mounting holes 328 disposed on second planar surface 326. In some aspects, each of the plurality of mounting holes 328 may be configured to receive a fastener for mounting front bracket 310 onto chassis 200. For example, plurality of mounting holes 328 may each comprise a diameter of approximately 0.172 inches and be configured to receive a flat head screw. Other diameter dimensions for plurality of mounting holes 328 are also contemplated, as well as other fastener or fastening mechanisms, which may comprise a nail, bolt, etc.

Figure 6B:
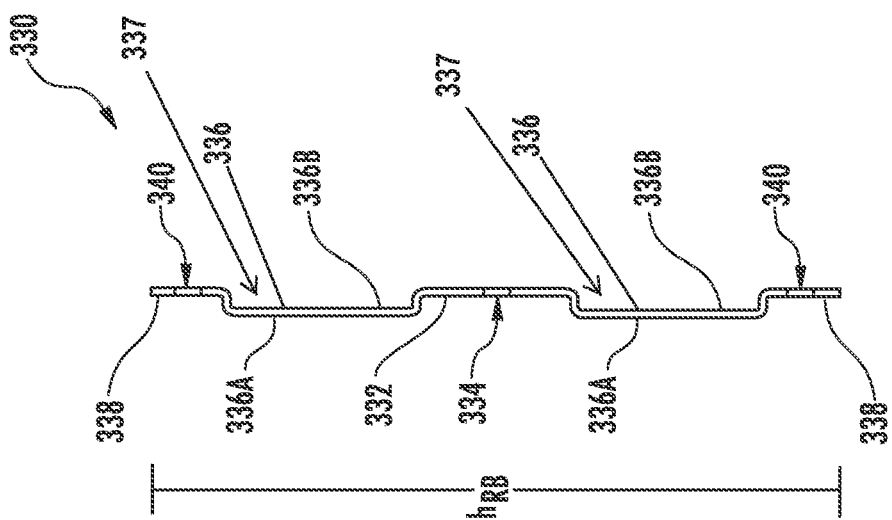
FIG. 6B is a bottom view illustrating the exemplary rear bracket of FIG. 6A.
Figure 6A:
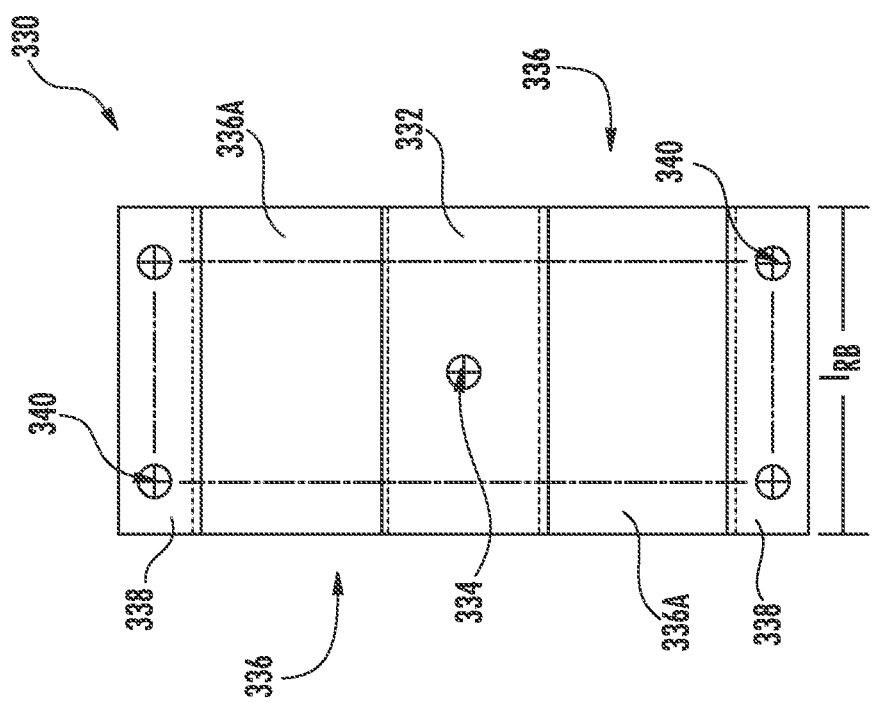
FIG. 6A is a side view illustrating an exemplary rear bracket of an equipment bracket according to an embodiment of the subject matter described herein.

Referring now to FIGS. 6A-6B in combination with FIG. 4, rear bracket 330 is illustrated in greater detail. Rear bracket 330 may be mounted to chassis 200 behind front bracket 310. In some aspects, rear bracket 330 comprises a height that is less than a height of front bracket 310. For example, a height of rear bracket $h_{RB}$ may be approximately 4.75 inches, which is less than a height of front bracket and chassis 200. A length of rear bracket $l_{RB}$ may be approximately 2.25 inches.

In some aspects, rear bracket 330 may comprise multiple planar surfaces offset from one another. For example, a first rear bracket surface, generally designated 332, may be offset from two second, parallel rear bracket surfaces, generally designated 336. First rear bracket surface 332 may comprise a planar surface approximately 1.03 inches in height and approximately 2.25 inches in length. Disposed centrally on first rear bracket surface 332 may be an aperture, generally designated 334. Aperture 334 may comprise a diameter of approximately 0.216 inches and be configured to receive a fastener, such as, for example, a screw, nail, bolt, etc., for mounting first rear bracket surface 332 of rear bracket 330 to chassis 200.

Two second, parallel rear bracket surfaces 336 may be disposed adjacent to first rear bracket surface 332 relative to opposing length edges of rear bracket surface 332. For example, and as illustrated in FIG. 6B, a first second, parallel rear bracket surface 336 is disposed at approximately a 90 degree angle along an opposing length edge of rear bracket surface 332 and the other second, parallel rear bracket surface 336 is disposed at approximately a 90 degree angle along the other opposing length edge of rear bracket surface 332. In some aspects, both of second, parallel rear bracket surfaces 336 may comprise a height of approximately 1.36 inches. In other aspects, each of second, parallel rear bracket surfaces 336 may be of two different heights. Regardless, second, parallel rear bracket surfaces 336 may be offset from rear bracket surface 332 by a certain distance or length measured from a top surface 336A to a bottom surface of third, parallel bracket surfaces, generally designated 338. For example, this length may be approximately 0.20 inches, although lengths more than or less than are also contemplated. Such a length may correspond to a thickness of one or more longitudinally extending prongs (356, FIG. 7A) housed adjacent to a bottom surface 336B of second, parallel rear bracket surfaces 336, to be discussed in more detail below.

Third, parallel bracket surfaces, generally designated 338 may be disposed adjacent to second, parallel rear bracket surfaces 336 relative to opposing length edges of second, parallel rear bracket surfaces 336. For example, and as illustrated in FIG. 6B, a first third, parallel bracket surface 338 is disposed at approximately a 90 degree angle along an opposing length edge of second, parallel rear bracket surface 336 and the other third, parallel rear bracket surface 338 may be disposed at approximately a 90 degree angle along the other opposing length edge of second, parallel rear bracket surface 336. In this manner, third, parallel bracket surfaces 338 may be coplanar with first rear bracket surface 332. In some aspects, both of third, parallel rear bracket surfaces 338 may comprise a height of approximately 0.50 inches. In other aspects, each of third, parallel bracket surfaces 338 may be of two different heights.

In order to mount rear bracket 330 to chassis 200, one or more aperture 340 may be provided on each of the two third, parallel bracket surfaces 338. For example, FIG. 6A illustrates two apertures 340 comprising a diameter of approximately 0.216 inches and configured to receive a fastener, such as, for example, a screw, nail, bolt, etc., for mounting third, parallel rear bracket surfaces 338 of rear bracket 330 to chassis 200.

Accordingly, second, parallel bracket surfaces 336 may form with rear bracket surface 332 and third, parallel rear bracket surfaces 338 a recess to receive one or more longitudinally extending prongs (356, FIG. 7A), disclosed in more detail below. In this manner, rear bracket surface 332 and third, parallel bracket surfaces 338 may be offset from second, parallel rear bracket surfaces 336 by a certain distance or length measured from a top surface 336A to a bottom surface of rear bracket surface 332 and a third, parallel bracket surfaces 338, respectively. For example, this length may be approximately 0.20 inches, although lengths more than or less than are also contemplated. Such a length may substantially correspond to a thickness of one or more longitudinally extending prongs housed adjacent to a bottom surface 336B of second, parallel rear bracket surfaces 336 (see, FIG. 4).

Referring now to FIGS. 7A-7B in combination with FIG. 4, rear bracket arm 350 is illustrated in greater detail. Rear bracket arm 350 may extend from rear rails 120B onto which it is fastened through rear bracket 330. In some aspects, for example, rear bracket arm 350 comprises a height $h_{RBA}$ of approximately 5.22 inches measured from a perpendicular plane, generally designated 352, at which rear bracket arm 350 is fastened to rear rails 120B of the rack via plurality of elongated holes 354. In other aspects, for example, rear bracket arm comprises a length $l_{RBA}$ of approximately 15 inches measured from perpendicular plane 352 to an end of one or more longitudinally extending prongs, generally designated 356. Advantageously, one or more longitudinally extending prongs 356 are longer than most conventional rear bracket prongs or arms, which are around five inches in length, in order to accommodate chassis 200 being set back or mounted farther back approximately 3.31 inches from a front of cabinet 110.

In some aspects, perpendicular plane 352 may comprise a surface that is compatible to fasten to standard equipment racks. For example, perpendicular plane 352 may be configured to be fastenable to rear rails 120B of cabinet 110.

Plurality of elongated holes 354 disposed on a surface of perpendicular plane 352 may correspond in size, shape, and/or location with holes 122 on rear rails 120B. Once aligned with holes 122 on rear rail 120B, plurality of elongated holes 354 may receive a fastener, such as, for example, a screw, bolt, nut, etc., used to secure rear bracket arm 350 to rail 120B. In some aspects, one or more alignment pins (not shown) may be disposed on perpendicular surface 352 in order to ease installation of chassis 200. Notably, rear bracket arm 350 may be installed onto rear rails 120B prior to being slid, or otherwise introduced, into rear brackets 330 or may be slid or introduced into rear brackets 330 before being installed onto rear rails 120B. For ease of installation and maneuverability, it may be more advantageous to first install rear bracket arm 350 onto rear rails 120B and then place equipment chassis 200 in equipment cabinet 110 by aligning one or more longitudinally extending prongs 356 of rear bracket arm 350 within a recess formed by rear bracket 330.

In some aspects, plurality of longitudinally extending prongs 356 may extend away from perpendicular surface 352. As illustrated in FIG. 7A, rear bracket arm 350 may comprise two longitudinally extending prongs disposed parallel to one another in a height direction. Each prong of the longitudinally extending prongs 356 may comprise a thickness sized and/or shaped to fit within the recess (e.g., see recess 337 in FIG. 6B) formed by second, parallel bracket surfaces 336 with rear bracket surface 332 and third, parallel rear bracket surfaces 338. As illustrated in FIG. 4, each prong of the longitudinally extending prongs 356 may be slotted into a respective recess in rear bracket 330, such that a first surface of longitudinally extending prongs 356 may be adjacent to chassis 200 and a second, opposing surface of longitudinally extending prongs 356 may be adjacent to bottom surface 336B of second, parallel rear bracket surfaces 336. In this manner, rear bracket arm 350 may not be mounted to chassis 200.

Referring back to FIG. 4, one or more front plate 370 may be provided to attach to a front of front rails 120A. For example, front plate 370 may comprise a plurality of holes 372 disposed on a longitudinally extending body that is sized and shaped similarly to pin surface 320. For example, twelve holes 372 may be disposed on front plate 370 which may comprise a height of approximately 6.975 inches and a width of approximately 0.875 inches, similar to that of pin surface 320. In some aspects, plurality of holes 372 may comprise a diameter of approximately 0.260 inches. However, plurality of holes 372 having a diameter that is larger or smaller is also contemplated. Additionally, it is also contemplated that plurality of holes 372 may not be perfectly circular and may be elongated, square, etc. Regardless, front plate 370 may be advantageously utilized where holes 122 disposed on front rails 120A are of a diameter greater than a diameter of a fastener (e.g., 124, FIGS. 1-3) to be used to fasten front bracket 310 to front rail 120A, as well as a diameter of plurality of holes 372. In this manner, front plate 370 may be disposed on an outside or front of front rail 120A in order to allow a fastener (e.g., 124, FIGS. 1-3) to be threaded through holes 122 and prevent them from falling through the large diameter holes 122. In some aspects, a washer (not shown) may be placed between fastener 124 and front plate 370.

Figure 8:
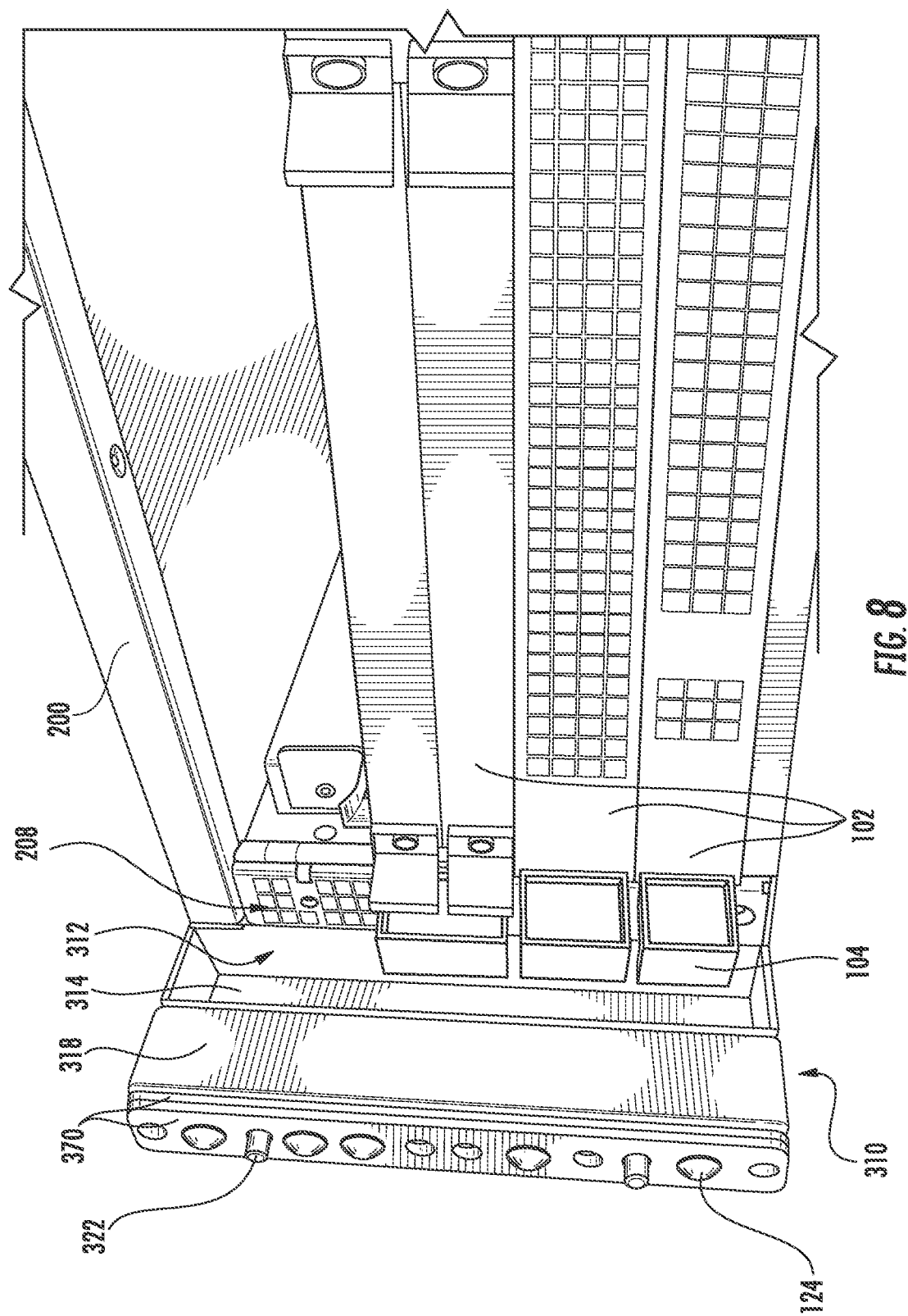
FIG. 8 is a front perspective view illustrating an exemplary left front bracket mounted to an equipment chassis according to an embodiment of the subject matter described herein.
Figure 9:
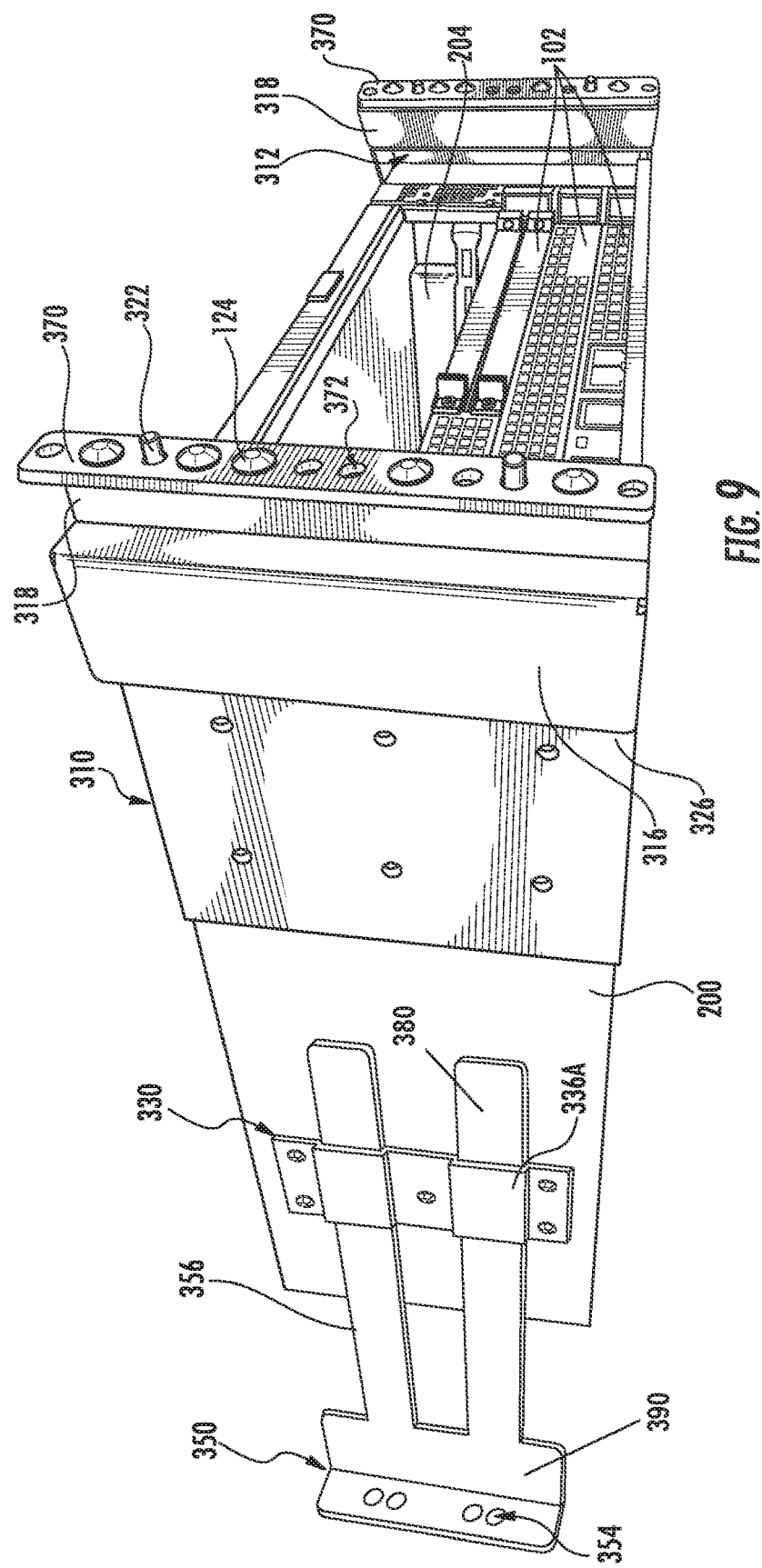
FIG. 9 is a side perspective view illustrating an exemplary equipment bracket including a left front bracket, a right front bracket, a left rear bracket, and a left rear arm bracket mounted to an equipment chassis according to an embodiment of the subject matter described herein.

Referring now to FIGS. 8 and 9, two separate views of equipment bracket 300 mounted to chassis 200 are illustrated. In FIG. 8, a front perspective view illustrates only a left front bracket 310 and two front plates 370 assembled relative to chassis 200. More specifically, chassis 200 supporting equipment 102 (three equipment modules) within is illustrated. An air vent 208 on a left side of chassis 200 is also illustrated. However, unlike conventional equipment brackets, which may block air vents, equipment bracket 300 comprises a front bracket 310 that includes an air flow pocket 312 having a flow surface 314 in which intake air may enter and be provided to equipment 102 supported by chassis 200. Front bracket 310 comprises first planar surface 318, which is illustrated as being perpendicular to air flow pocket 312. Two alignment pins 322 are provided on a pin surface 320, which is covered by two front plates 370. Five fasteners 124 are illustrated as being used to tighten front plates 370 to pin surface 320. As can be seen from FIG. 8, front bracket 310 may be mounted towards a front of equipment chassis 200. For example, front bracket 310 may be mounted at a front end of equipment chassis 200 such that the front end of chassis 200 is not flush with a front edge of front bracket 310 (i.e., pin surface 320). More particularly, front bracket 310 may be mounted to equipment chassis 200 so that air flow pocket 312 of front bracket 310 is disposed in front of a front edge of the equipment chassis 200 in order to enable air intake to initially flow into air flow pocket 312 and then flow into air vent 208. In this mounting position of front bracket 310, in combination with first planar surface 318, chassis 200 may be mounted an additional 3.31 inches farther back from front rails 120A (see, FIGS. 1-3).

In a side perspective view illustrated in FIG. 9, a left front bracket 310, right front bracket 310, left rear bracket 330, left rear arm bracket 350, left front plate 370, and right front plate 370 mounted on chassis 200. More specifically, and as illustrated in FIG. 8, a left front bracket 310, as well as a right front bracket 310, may be mounted towards a front of equipment chassis 200. Also illustrated in FIG. 9, a back surface 316 of air flow pocket 312 is illustrated with a plurality of fasteners disposed in plurality of front bracket mounting holes 328 in second planar surface 326. First planar surface 318 is illustrated as being perpendicular to air flow pocket 312. Two alignment pins 322 are provided on a pin surface 320, which is covered by one front plate 370. Five fasteners 124 are illustrated as being used to tighten front plates 370 to pin surface 320. Rear bracket 330 is illustrated as being mounted behind left front bracket 310 on equipment chassis 200. For example, rear bracket 330 is mounted adjacent a rear end of chassis 200 at apertures 334 and 340 at approximately one inch from a rear most set of mounting holes disposed on side edges 202, 204 of chassis 200. A first portion 380 of each of one or more longitudinally extending prongs 356 are illustrated as being slid within recesses formed by second, parallel rear bracket surfaces 336 with rear bracket surface 332 and third, parallel rear bracket surfaces 338 (see, FIGS. 6A-6B). As a result, each of longitudinally extending prongs is adjacent to a bottom surface 336A of second, parallel rear bracket surface 336 of rear bracket 330. A second portion 390 of rear bracket arm 350 including perpendicular plane 352 extends past a ventilated rear end of chassis 200. Plurality of elongated holes 354 disposed on perpendicular plane 352 are configured to receive fasteners 124 for fastening rear bracket arm 350 to a rear surface of rear rails 120B (see FIGS. 1-3).

Figure 10:
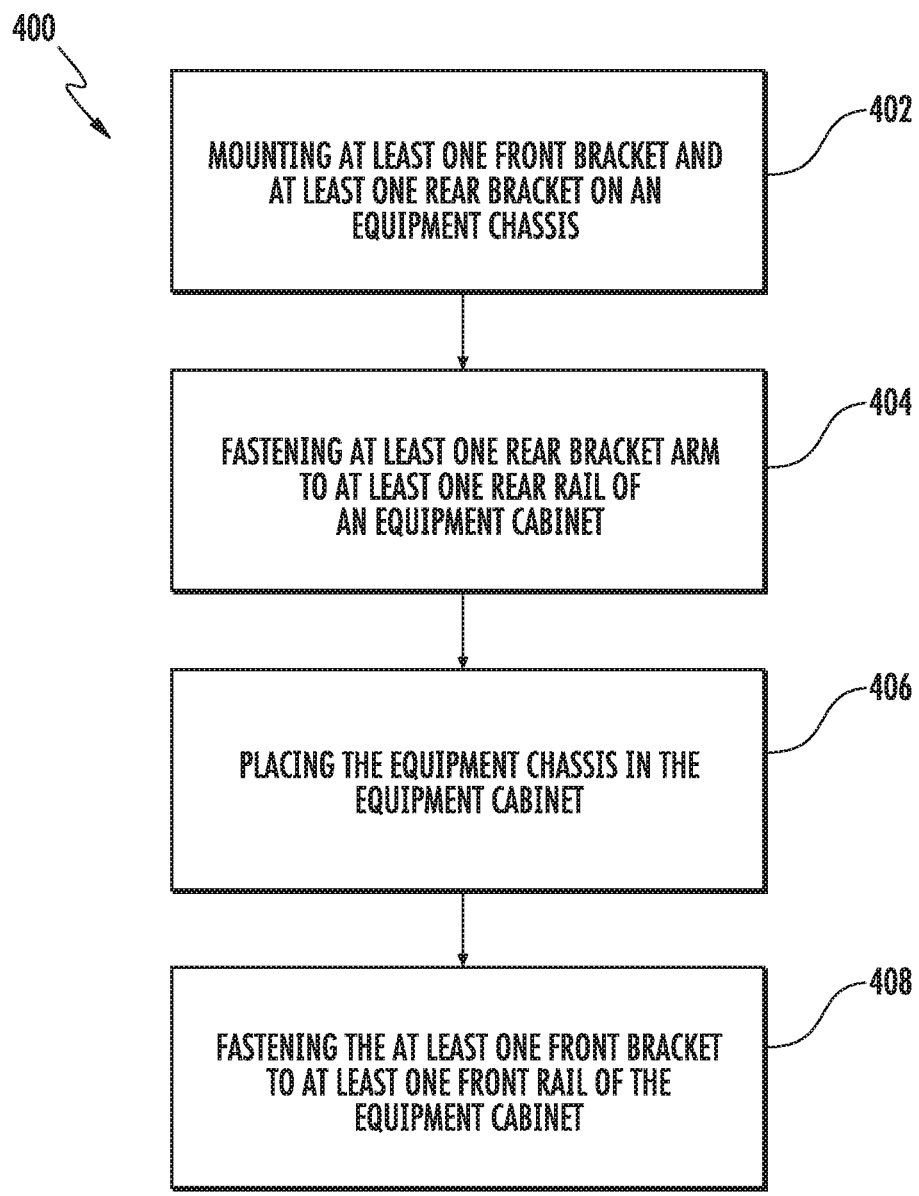
FIG. 10 is a flow diagram illustrating an exemplary method for installing an exemplary equipment bracket in an equipment cabinet according to an embodiment of the subject matter described herein.

Referring to FIG. 10, exemplary steps of a method, generally designated 400, for installing an equipment bracket in an equipment cabinet are disclosed. In some aspects, method 400 may be utilized for installing an equipment bracket 300 into an equipment cabinet 110, as described above in reference to FIGS. 1-9, such as a 700 mm Panduit cabinet by VCE Company, LLC, by an individual installer. Additionally, more than one installer may be needed depending on a weight of the equipment supported in the chassis.

In block 402, at least one front bracket 310 is mounted towards a front of an equipment chassis 200 and at least one rear bracket 330 is mounted behind at least one front bracket 310 on equipment chassis 200, wherein at least one front bracket 310 comprises an air flow pocket 312 configured to allow air intake to pass through air flow pocket 312 before being vented through air vents 208 disposed on equipment chassis 200.

In block 404, at least one rear bracket arm 350 is fastened to at least one rear rail 120B of equipment cabinet 110.

In some aspects, at least one front bracket 310 comprises a length of approximately 8.31 inches and at least one rear bracket arm 350 comprises a length of approximately 15 inches.

In block 406, equipment chassis 200 is placed in equipment cabinet 110 by aligning at least a first portion of one or more longitudinally extending prongs 356 of at least one rear bracket arm 350 within a recess formed by at least one rear bracket 330 mounted to equipment chassis 200.

In some aspects, at least a second portion of one or more longitudinally extending prongs 356 extends past a rear end of the equipment chassis 200.

In some aspects, at least one rear bracket 330 comprises a recess formed by a first rear bracket surface 332, two second, parallel rear bracket surfaces 336, and two, third parallel rear bracket surfaces 338 coplanar with first rear bracket surface 332 such that one or more longitudinally extending prongs 356 are recessed adjacent to a bottom surface 336B of second, parallel rear bracket surface 336 of at least one rear bracket 330.

In block 408, at least one front bracket 310 is fastened to at least one front rail 120A of equipment cabinet 110.

In some aspects, method 400 further comprises fastening at least one front plate 370 to a front of at least one front rail 120A of equipment cabinet 110, wherein at least one front plate 370 comprises a plurality of holes 372 configured to receive one or more fasteners 124 for fastening at least one front bracket 310 to a rear of at least one front rail 120A.

In some aspects, method 400 further comprises completely closing a front door 112 of equipment cabinet 110 over service handles 104 of rack-mounted equipment 102 supported in equipment chassis 200. In this closed position, for example, service handles 104 may be approximately 3.75 inches from front door 112.

In some aspects, method 400 further comprises aligning one or more alignment pins 322 disposed on a pin surface 320 of at least one front bracket 310 within a plurality of holes 122 of at least one front rail 120A of equipment cabinet 110.

Accordingly, it will be appreciated that exemplary method 400 is for illustrative purposes and that different and/or additional actions may be used. It will also be appreciated that various actions described herein may occur in a different order or sequence.

It will be understood that various details of the subject matter described herein may be changed without departing from the scope of the subject matter described herein. Furthermore, the foregoing description is for the purpose of illustration only, and not for the purpose of limitation, as the subject matter described herein is defined by the claims as set forth hereinafter

What is claimed is:

1. An equipment bracket comprising:
at least one front bracket mounted towards a front of an equipment chassis and configured to be fastened to at least one front rail of an equipment cabinet, wherein the at least one front bracket comprises an air flow pocket configured to allow air intake to pass through the air flow pocket before being vented through air vents disposed on the equipment chassis;
at least one rear bracket mounted behind the at least one front bracket on the equipment chassis; and
at least one rear bracket arm comprising one or more longitudinally extending prongs having at least a first portion recessed within the at least one rear bracket and configured to be fastened to at least one rear rail of the equipment cabinet.

2. The equipment bracket of claim 1, wherein at least a second portion of the one or more longitudinally extending prongs extends past a rear end of the equipment chassis.

3. The equipment bracket of claim 1, wherein a front door of the equipment cabinet is configured to completely close over service handles of rack-mounted equipment supported in the equipment chassis.

4. The equipment bracket of claim 1, wherein the at least one front bracket is mounted to the equipment chassis so that the air flow pocket of the at least one front bracket is disposed in front of a front edge of the equipment chassis.

5. The equipment bracket of claim 1, further comprising at least one front plate fastened to a front of the at least one front rail of the equipment cabinet, wherein the at least one front plate comprises a plurality of holes configured to receive one or more fasteners for fastening the at least one front bracket to a rear of the at least one front rail.

6. The equipment bracket of claim 1, wherein the at least one front bracket further comprises a pin surface including one or more alignment pins configured to align within a plurality of holes of the at least one front rail of the equipment cabinet.

7. The equipment bracket of claim 1, wherein the at least one rear bracket comprises a recess formed by a first rear bracket surface, two second, parallel rear bracket surfaces, and two, third parallel rear bracket surfaces coplanar with the first rear bracket surface such that the one or more longitudinally extending prongs are recessed adjacent to a bottom surface of the second, parallel rear bracket surface of the at least one rear bracket.

8. A rack-mounted equipment system comprising:
rack-mounted equipment comprising service handles;
an equipment cabinet for storing the rack-mounted equipment, the equipment cabinet comprising a front door; and
an equipment chassis installed in the equipment cabinet for supporting the rack-mounted equipment stored in the equipment cabinet; and
an equipment bracket comprising:
at least one front bracket mounted towards a front of the equipment chassis and configured to be fastened to at least one front rail of the equipment cabinet, wherein the at least one front bracket comprises an air flow pocket configured to allow air intake to pass through the air flow pocket before being vented through air vents disposed on the equipment chassis,
at least one rear bracket mounted behind the at least one front bracket on the equipment chassis, and
at least one rear bracket arm comprising one or more longitudinally extending prongs having at least a first portion recessed within the at least one rear bracket and configured to be fastened to at least one rear rail of the equipment cabinet.

9. The rack-mounted equipment system of claim 8, wherein at least a second portion of the one or more longitudinally extending prongs extends past a rear end of the equipment chassis.

10. The rack-mounted equipment system of claim 8, wherein the front door of the equipment cabinet is configured to completely close over the service handles of the rack-mounted equipment supported in the equipment chassis.

11. The rack-mounted equipment system of claim 8, wherein the at least one front bracket is mounted to the equipment chassis so that the air flow pocket of the at least one front bracket is disposed in front of a front edge of the equipment chassis.

12. The rack-mounted equipment system of claim 8, wherein the equipment bracket comprises at least one front plate fastened to a front of the at least one front rail of the equipment cabinet, wherein the at least one front plate comprises a plurality of holes configured to receive one or more fasteners for fastening the at least one front bracket to a rear of the at least one front rail.

13. The rack-mounted equipment system of claim 8, wherein the at least one front bracket further comprises a pin surface including one or more alignment pins configured to align within a plurality of holes of the at least one front rail of the equipment cabinet.

14. The rack-mounted equipment system of claim 8, wherein the at least one rear bracket comprises a recess formed by a first rear bracket surface, two second, parallel rear bracket surfaces, and two, third parallel rear bracket surfaces coplanar with the first rear bracket surface such that the one or more longitudinally extending prongs are recessed adjacent to a bottom surface of the second, parallel rear bracket surface of the at least one rear bracket.

15. A method for installing an equipment bracket in an equipment cabinet, the method comprising:
mounting at least one front bracket towards a front of an equipment chassis and at least one rear bracket behind the at least one front bracket on the equipment chassis, wherein the at least one front bracket comprises an air flow pocket configured to allow air intake to pass through the air flow pocket before being vented through air vents disposed on the equipment chassis;
fastening at least one rear bracket arm to at least one rear rail of the equipment cabinet;
placing the equipment chassis in the equipment cabinet by aligning at least a first portion of one or more longitudinally extending prongs of the at least one rear bracket arm within a recess formed by the at least one rear bracket mounted to the equipment chassis; and
fastening the at least one front bracket to at least one front rail of the equipment cabinet.

16. The method of claim 15, wherein at least a second portion of the one or more longitudinally extending prongs extends past a rear end of the equipment chassis.

17. The method of claim 15, further comprising completely closing a front door of the equipment cabinet over service handles of rack-mounted equipment supported in the equipment chassis.

18. The method of claim 15, further comprising fastening at least one front plate to a front of the at least one front rail of the equipment cabinet, wherein the at least one front plate comprises a plurality of holes configured to receive one or more fasteners for fastening the at least one front bracket to a rear of the at least one front rail.

19. The method of claim 15, further comprising aligning one or more alignment pins disposed on a pin surface of the at least one front bracket within a plurality of holes of the at least one front rail of the equipment cabinet.

20. The method of claim 15, wherein the at least one rear bracket comprises a recess formed by a first rear bracket surface, two second, parallel rear bracket surfaces, and two, third parallel rear bracket surfaces coplanar with the first rear bracket surface such that the one or more longitudinally extending prongs are recessed adjacent to a bottom surface of the second, parallel rear bracket surface of the at least one rear bracket.

* * * * *